United States Patent
Hsu

(10) Patent No.: US 8,599,606 B2
(45) Date of Patent: Dec. 3, 2013

(54) MEMORY BIT REPAIR SCHEME

(75) Inventor: Wah Nam Hsu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 13/398,238

(22) Filed: Feb. 16, 2012

(65) Prior Publication Data

US 2013/0215671 A1    Aug. 22, 2013

(51) Int. Cl.
*G11C 11/00* (2006.01)

(52) U.S. Cl.
USPC ............................ 365/158; 365/200; 365/201

(58) Field of Classification Search
None
See application file for complete search history.

(56) References Cited

U.S. PATENT DOCUMENTS

| 5,771,346 | A | 6/1998 | Norman et al. |
| 6,950,334 | B2 * | 9/2005 | Shimizu et al. ............... 365/158 |
| 7,260,004 | B2 * | 8/2007 | Lamorey et al. ............... 365/201 |
| 7,778,070 | B2 * | 8/2010 | Nirschl et al. ............... 365/163 |
| 2004/0022085 | A1 | 2/2004 | Parkinson et al. |
| 2005/0190615 | A1 | 9/2005 | Linde et al. |

OTHER PUBLICATIONS

International Search Report and Written Opinion—PCT/US2013/026500—ISA/EPO—Jul. 3, 2013.

* cited by examiner

*Primary Examiner* — Tan T. Nguyen

(74) *Attorney, Agent, or Firm* — Sam Talpalatsky; Nicolas J. Pauley; Joseph Agusta

(57) ABSTRACT

A memory device for providing memory bit repair. The memory device may include memory cells. Each of the memory cells may include a measurable characteristic that identifies a stored data value. At least one of the memory cells may have a measurable characteristic set to a defective bit state. A defective bit state may refer to a measurable characteristic set to be outside of a working measureable characteristic range. The defective bit state may enable memory bit repair by identifying the at least one memory cell as being defective.

20 Claims, 10 Drawing Sheets

MEMORY BIT REPAIR SCHEME

CROSS REFERENCE TO RELATED APPLICATION

1. Technical Field

The present disclosure generally relates to memory devices. More specifically, the present disclosure relates to a memory bit repair scheme.

2. Background

Conventional memory repair schemes generally use row, column, or block redundancy to replace defective rows, columns, and/or bits. These conventional schemes, however, are not effective when the memory has a random bit defect. In addition, row, column, or block redundancy is limited to repairing one bit at a time. An identifiable value may include but is not limited to a logic "0" value or a logic "1" value. As described herein, a random bit defect may refer to the inability of a memory cell to store an identifiable value.

The majority of defects incurred by memory types, such as magnetic random access memory (MRAM) include random bit defects. Random bit defects within an MRAM, may be caused by stuck bits. As described herein, a stuck bit may refer to a bit that cannot be identified as having a predetermined value. For example, a stuck bit cannot be identified as a zero "0" value or a one "1" value. As a result, conventional memory repair schemes may not be effective for repairing high random bit defects within certain types of memory, such as MRAM.

BRIEF DESCRIPTION OF THE DRAWINGS

For a more complete understanding of the present disclosure, reference is now made to the following description taken in conjunction with the accompanying drawings.

SUMMARY

Figure 1:
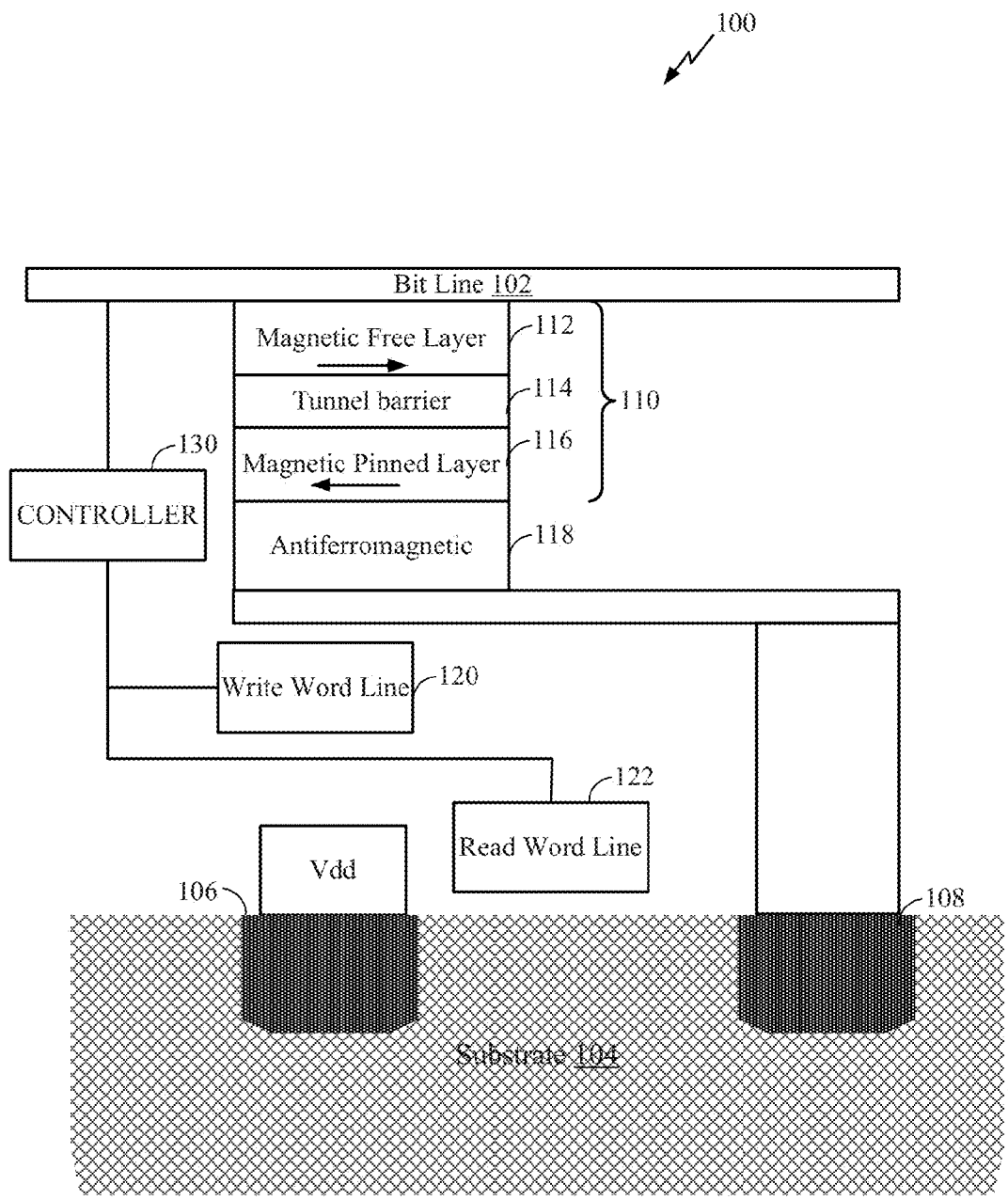
FIG. 1 is a block diagram of a memory device including a controller for performing memory bit repair according to aspects of the present disclosure.

According to one aspect of the present disclosure, a memory device for providing memory bit repair is described. The memory device may include memory cells. Each of the memory cells may include a measurable characteristic that identifies a stored data value. At least one of the memory cells may have a measurable characteristic that is set to a defective bit state. A defective bit state may refer to a measurable characteristic set to be outside of a working measureable characteristic range. The defective bit state may enable memory bit repair by identifying the at least one memory cell as being defective.

According to one aspect of the disclosure, a method for memory bit repair is described. The method includes reading a measurable characteristic of a memory cell of the memory device. The method may also include identifying the memory cell as having a defective bit state when the measurable characteristic of the memory cell is set outside of a working measurement range. The method may also include filtering at least one memory cell having the defective bit state during operation of the memory device.

In a further aspect of the disclosure a memory device for providing memory bit repair is described. The memory device may include data storage means. Each of the data storage means may include a means for identifying at least one data storage means as having a defective bit state. The identifying means may be a measurable characteristic that identifies a stored data value. At least one of the data storage means may have a measurable characteristic set to a defective bit state. A defective bit state may refer to a measurable characteristic that is set to be outside of a working measureable characteristic range. The defective bit state may enable memory bit repair by identifying the at least one of the data storage means as being defective.

In a further aspect of the disclosure, a method for repairing defective memory cells of a memory device is described. The method includes the step of reading a measurable characteristic of a memory cell of the memory device. The method may also include the step of identifying the memory cell as having a defective bit state when the measurable characteristic of the memory cell is set outside of a working measurement range. The method may also include the step of filtering at least one memory cell having the defective bit state during operation of the memory device.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

One aspect of the disclosure describes a memory bit repair scheme for a high bit defect memory. High bit defect memories may include but are not limited to MRAM, resistive random-access memory (RRAM), phase change random-access memory (PC-RAM), and the like. In this aspect of the disclosure, the memory bit repair scheme involves a memory device including multiple memory cells, each memory cell having a measurable characteristic. During device fabrication of the memory device, certain memory cells incur random bit memory cell defects. In one configuration of the memory device, a measurable characteristic of each defective memory cell is set outside of a working range. These defective memory cells, although not repaired, are avoided during operation of the memory device. This configuration of the memory device may be performed during device testing to identify the defective memory cell as having a defective bit state. In one aspect of the disclosure, the defective cells are determined according to a random bit defect report from the foundry. The measurable characteristic may include but is not limited to a resistance value, a capacitance value, an inductance value, or other like adjustable characteristic value.

In another configuration, the memory device is communicably coupled to a controller during testing. The controller may alter or set the measurable characteristic of defective memory cells (e.g., memory cells having a random bit defect) to be outside a working measurable characteristic range. In this configuration, during operation of the memory device, memory cells having a measurable characteristic that is outside the measurable characteristic range are identified as defective memory cells. These defective memory cells are not used to store or read data during operation of the memory device.

FIG. 1 is a block diagram of a memory device 100 that is coupled to a controller 130 during testing for performing memory bit repair according to aspects of the present disclosure. Unlike conventional random access memory (RAM) chip technologies, in magnetic RAM (MRAM) data is not stored as electric charge, but is instead stored by magnetic polarization of storage elements. In the configuration shown in FIG. 1, the memory device includes a memory cell 110, such as a magnetic tunnel junction (MTJ) structure. The memory cell 110 is formed from two ferromagnetic layers 112 and 116 that are separated by a tunnel barrier layer 114.

As shown in FIG. 1, one of the two ferromagnetic layers is referred to as the fixed (magnetic pinned) layer 116 and the other ferromagnetic magnetic layer is referred to as the magnetic free layer 112. A magnetic tunnel junction (MTJ) is a type of memory cell 110 having a magnetic pinned layer 116, a tunnel barrier layer 114, and a magnetic free layer 112. In this configuration, the magnetic pinned layer has a magnetization that is fixed in a particular direction and the magnetic free layer 112 has a magnetization direction that can be altered.

The memory cell 110 shown in FIG. 1, is connected to a substrate 104 via an anti-ferromagnetic layer 118. Representatively, the substrate may be a positive substrate (p-substrate) having negative metal oxide semiconductor (NMOS) devices 106 and 108. In this configuration, the NMOS device 108 is connected to the anti-ferromagnetic layer 118 and the NMOS device 106 is connected to a voltage source (Vdd).

During operation, the memory cell 110 represents either a "1" value when the magnetic free layer 112 magnetization is anti-parallel to the magnetic pinned layer 116 magnetization, or a "0" value when the magnetic free layer 112 magnetization is parallel to the magnetic pinned layer 116 magnetization, or vice versa. A memory device, such as an MRAM, includes an array of individually addressable MTJs 110.

The electrical resistance of an MTJ memory cell 110 depends on whether the magnetic free layer 112 magnetization and the magnetic pinned layer 116 magnetization are parallel or anti-parallel with each other. When the magnetizations of the MTJ's magnetic free layer 112 and magnetic pinned layer 116 are oriented parallel to each other, the MTJ 110 presents a resistance that is different than the resistance the MTJ 110 would present if the magnetizations of the magnetic free layer 112 and the magnetic pinned layer 116 were in an anti-parallel orientation. In a conventional MRAM, two distinct states are defined by two different resistances of an MTJ in a bitcell of the MRAM. The two different resistances represent a logic "0" and a logic "1" value stored by the MTJ.

In the case of MRAM, when the memory cell 110 is a magnetic tunnel junction (MTJ), its measurable characteristic is resistance. As shown in FIG. 1, a controller 130 is coupled to the MRAM cell or MTJ 110 during testing. The controller 130 is connected to a bit line 102, a write word line 120, and/or a read word line 122. In this configuration, the controller 130 reads or writes to the MTJ 110 by applying a predetermined voltage or current level to each MTJ memory cell.

In this configuration, the controller applies a predetermined voltage or current level to the at least one memory cell 110 to breakdown an interlayer dielectric of the memory cell 110. Breakdown of the interlayer dielectric of the memory cell 110 results in the storage of a measurable characteristic that is outside a working resistance range. That is, the application of the predetermined current/voltage alters a measurable resistance of the MTJ memory 110 to move the measurable resistance of the MTJ memory cell 110 outside a working resistance range. In this configuration, a memory cell that has a measurable characteristic that is set outside of a working measureable characteristic range identifies the memory cell as having a defective bit state. During operation of the memory device 100, a filter logic prevents memory cells that have a defective bit state from being used during read and/or write operations to/from the memory device 100.

Figure 2:
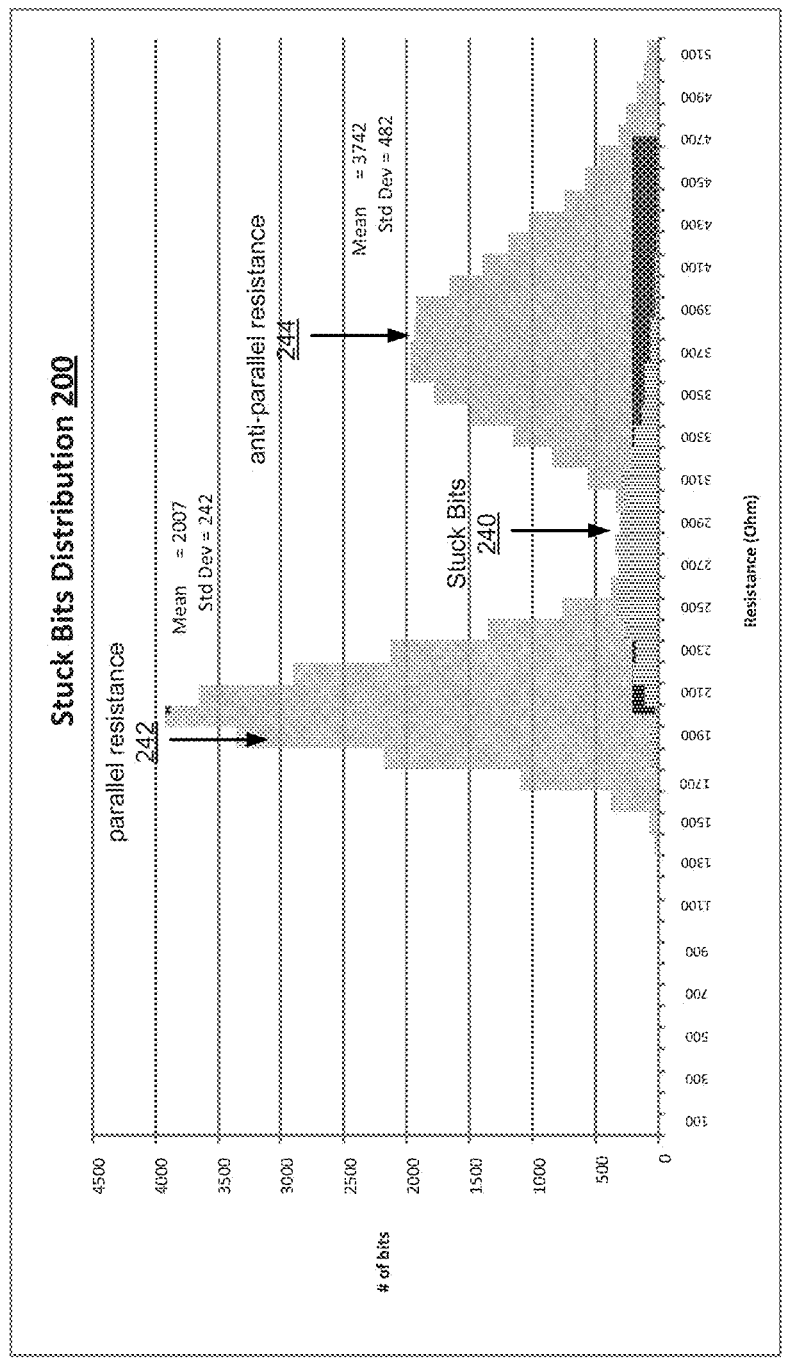
FIG. 2 is graph illustrating a distribution of random bit defects within a memory device according to aspects of the present disclosure.

FIG. 2 is graph illustrating a distribution 200 of random bit defects (stuck bits) 240 within a memory device according to aspects of the present disclosure. Representatively, the stuck bits 240 cannot be identified as having a parallel resistance within the parallel resistance range 242 or an anti-parallel resistance within the anti-parallel resistance range 244. As shown in FIG. 2, a logic "1" value is represented by the anti-parallel resistance range 244 and a logic "0" value is represented by the parallel resistance range 242. The stuck bits 240 represent memory cells that have a random bit defect. That is, a resistance value of the stuck bits cannot be used to identify either a logic "0" value or a logic "1".

Figure 3:
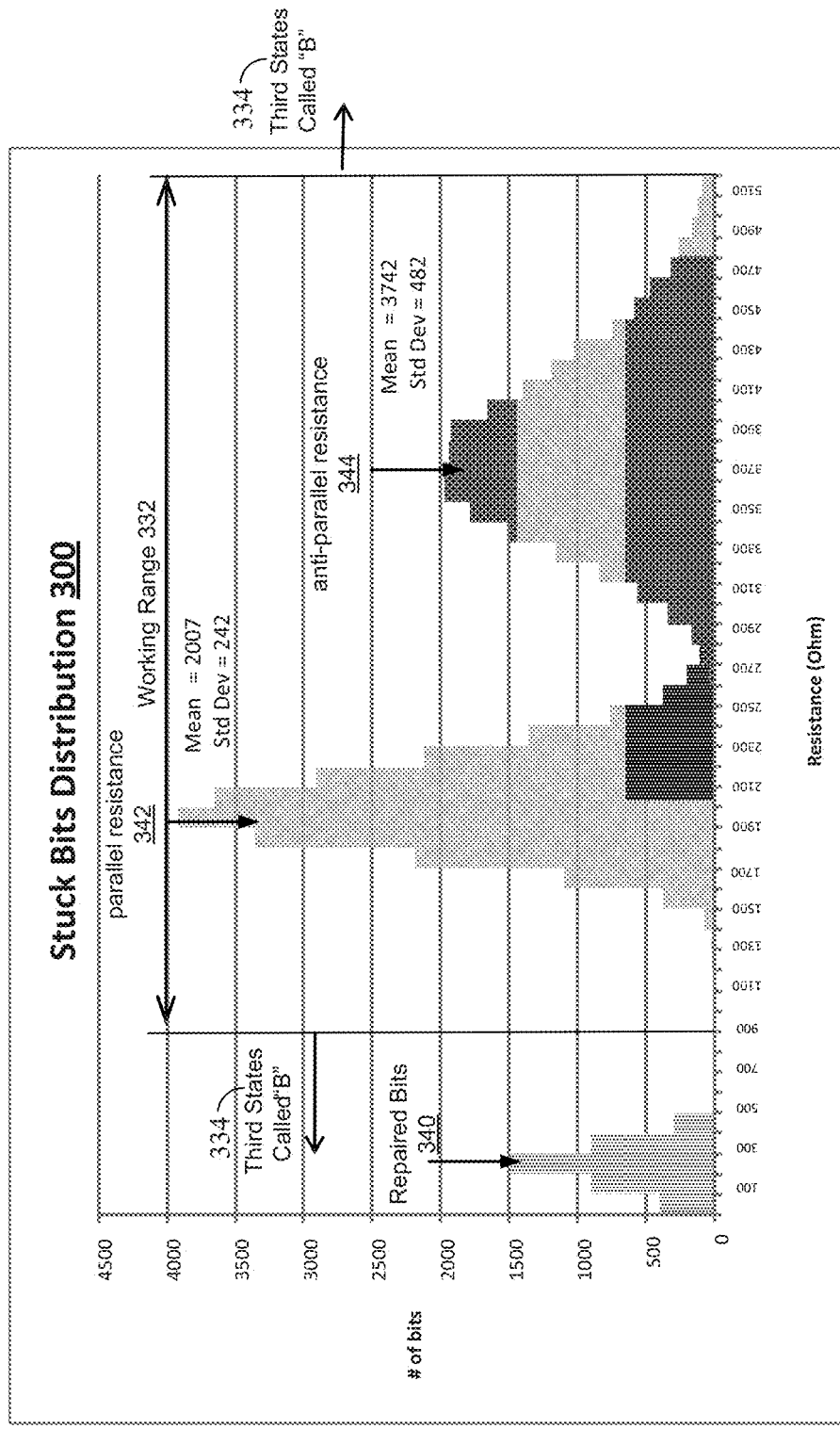
FIG. 3 is graph illustrating a distribution of random bit defects within a memory device following repair of the memory cells according to aspects of the present disclosure.

FIG. 3 is graph illustrating a distribution 300 of random bit defects within a memory device following repair of the memory cells 340 according to aspects of the present disclosure. Representatively, a working resistance range of 900 Ohms to 5100 Ohms is defined in which the parallel resistance range 342 and the anti-parallel resistance range 344 are located. As shown in FIG. 3, the memory cells corresponding to the stuck bits 240 are repaired by moving a resistance level of the stuck bits 240 outside a working (measurable characteristic) range 332. For example, stuck bits 240 may be assigned a resistance level that is less than 900 Ohms or greater than 5100 Ohms to enable identification of the defective bit state "B" 334 including the repaired memory cells 340. In one configuration, application of a predetermined current/voltage alters a measurable resistance of the memory cells corresponding to the stuck bits 240 to move the measurable resistance of these memory cells outside a working resistance range 332. Once outside the measurable working resistance range 332, the bits are referred to as repaired bits 340.

By applying a high voltage to the stuck bits 240, the interlayer oxide of the stuck bits 240 breaks down (i.e., are blown). As shown in FIG. 3, the stuck bits 240 are moved to the left of a distribution of the parallel resistance range 342 or to the right of a distribution of the anti-parallel resistance range 344.

Representatively, a resistance level of the repaired bits 340 is outside the working resistance range 332 and within a defective bit state "B" 334. In this configuration, a memory cell that has a measurable characteristic set outside of a working measureable characteristic range identifies the memory cell as having the defective bit state "B" 334. That is, a third state "B" (i.e, "blown") 334 defines a defective bit state 334 for memory cells that have a resistance level outside of the working resistance range 332.

Figure 4:
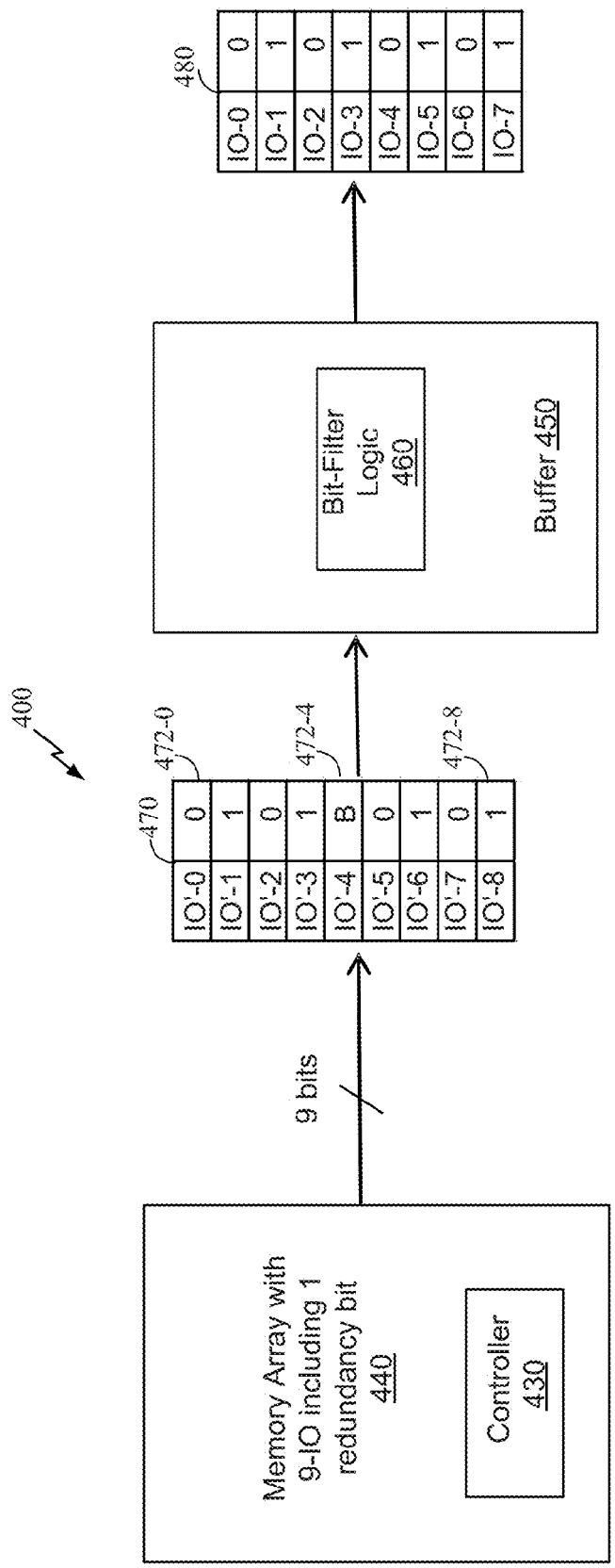
FIG. 4 is a block diagram illustrating an input/output interface that includes bit filter logic according to aspects of the present disclosure.

FIG. 4 is a block diagram illustrating an input/output interface 400 having a memory device 440, a temporary storage 470, and a buffer 450 that includes bit filter logic 460 according to aspects of the present disclosure. In this configuration, the memory device 440 is a 9-bit input/output (I/O) memory-cell (e.g., MTJ) array including a 1-bit redundancy. Representatively, the temporary storage (e.g., a latch) 470 includes nine storage areas with a 1 redundancy bit 472 (472-0, . . . , 472-8). In this example, the storage area 472-4 corresponds to a memory cell of the memory device 440 that has a random bit defect. According to an aspect of the disclosure, the measurable resistance of the memory cell corresponding to the storage area 472-4 is set outside of a working resistance range during testing of the memory device 440, using the controller 430. As shown in FIG. 4, the storage area 472-4 corresponding to the defective memory cell is identified as a "B" (defective bit) state during operation of the memory device 440.

In this configuration, the bit filter logic 460 of the buffer 450 filters the storage area 472-4 that has the defective bit state "B". Representatively, data from the defective I/O memory cell corresponding to the storage area 472-4 is not passed to the user. The defective I/O memory cell corresponds to the 1-redundancy bit. As shown in FIG. 4, an 8-bit output value 480 is provided to the user from the storage areas 472-0, 472-1, 472-2, 472-3, 472-5, 472-6, 472-7, and 472-8. That is, the bit filter logic 460 removes the defective memory cell corresponding to the storage area 472-4, having the defective bit state "B", from use during operation of the memory device 440. The bit filter logic 460 removes the defective value by only selecting the first eight storage areas 472 having a measurable characteristic within the working measurable characteristic range.

Figure 5:
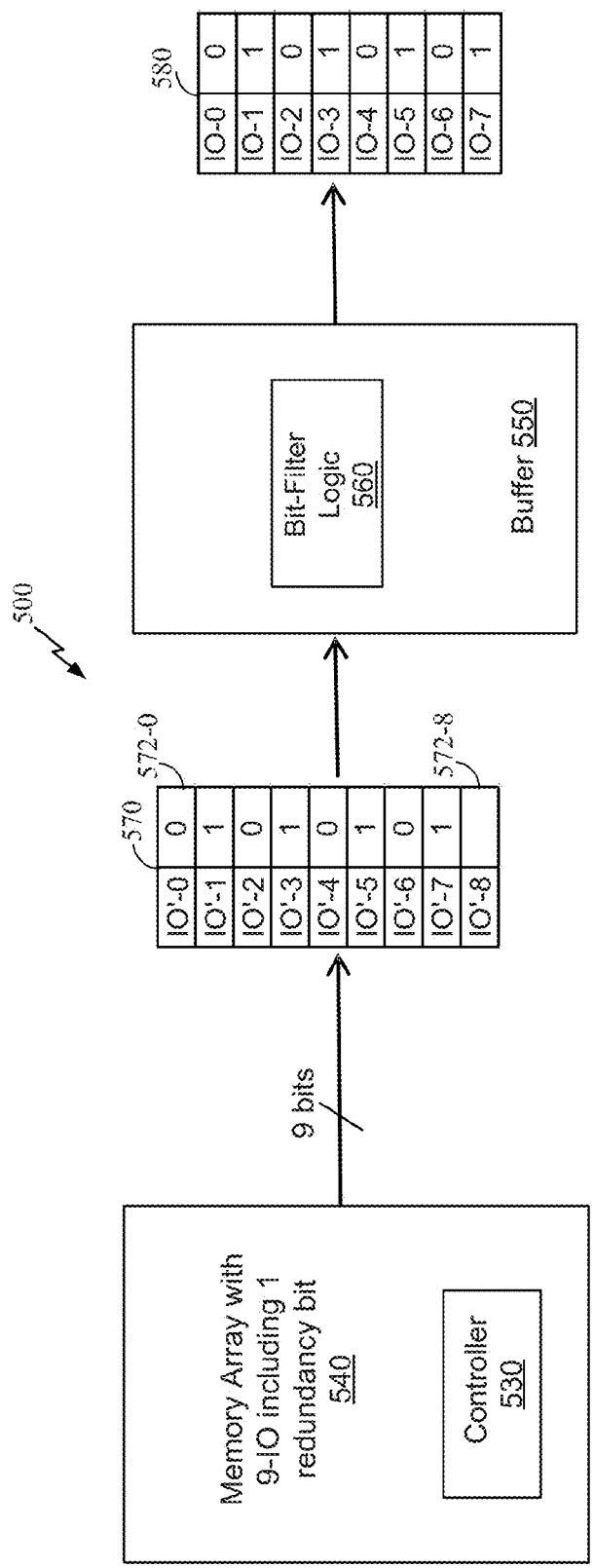
FIG. 5 is a block diagram illustrating the input/output interface of FIG. 4 during a read operation according to aspects of the present disclosure.

FIG. 5 is a block diagram illustrating the input/output interface 500 of FIG. 4, including a memory device 540 having a controller 530, a temporary storage 570, and a buffer 550 that includes a bit filter logic 560 according to aspects of the present disclosure. Representatively, no random bit defects are detected in each to the storage areas 572 (572-0, . . . , 572-8) corresponding to all nine I/O memory cells of the memory device 540. In one aspect of the disclosure, the bit filter logic 560 determines a working resistance range of the memory device 540. During operation of the memory device 540, the bit filter logic 560 reads each of the memory cells to determine when a resistance of any of the memory cells is set to be outside the working resistance range by the controller 530, for example, during testing of the memory device 540. In this configuration, the first eight storage areas 572-0 to 572-7 are used because no defective bit cells are detected. That is, the buffer 550 reads the first eight storage areas entries 572-0 to 572-7 sequentially, thereby ignoring storage area 572-8, when no defective bits cells are identified within the storage areas 572, to provide the user output 580.

Figure 6:
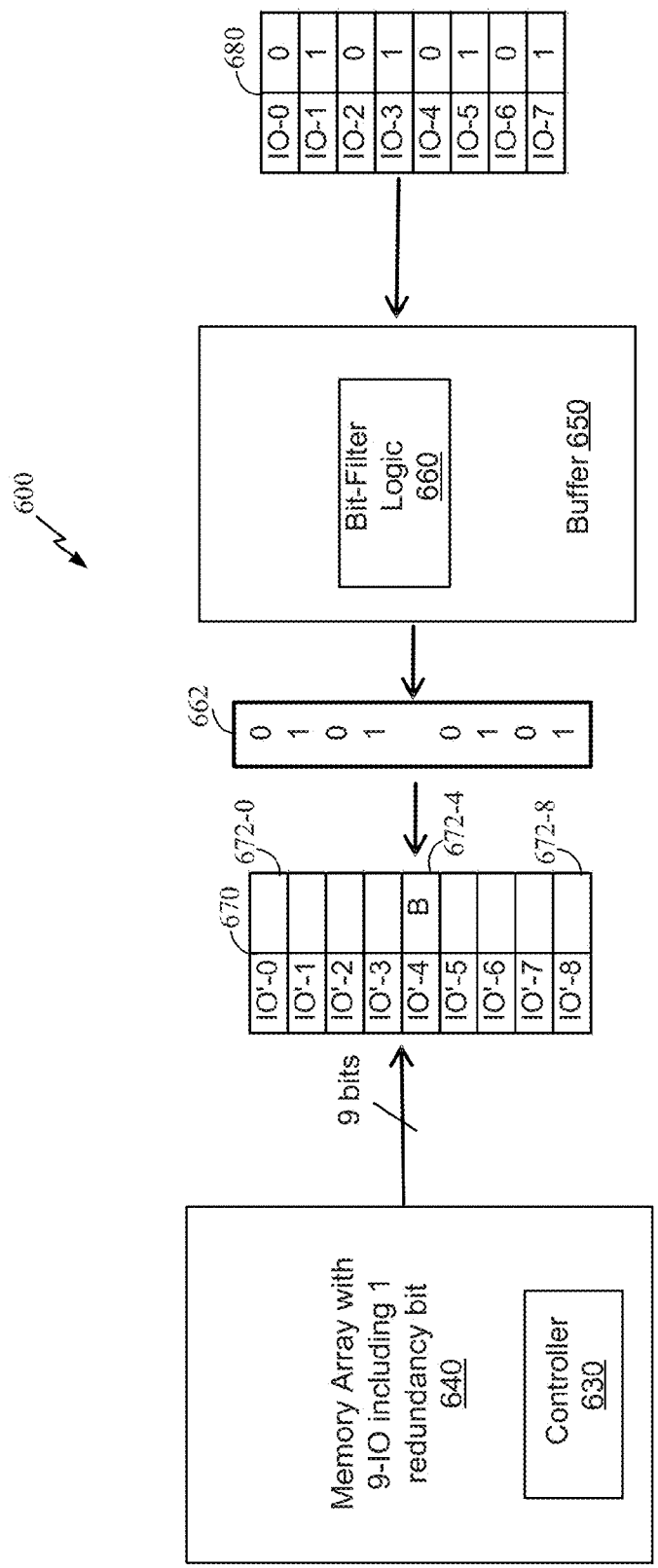
FIG. 6 is a block diagram illustrating the input/output interface of FIG. 4 during a write operation according to aspects of the present disclosure.

FIG. 6 is a block diagram illustrating the input/output interface 600 of FIG. 4 during a write operation according to aspects of the present disclosure. Representatively, a user input 680 includes an 8-bit value that is being written to the memory device 640 as part of a write operation. For the write operation, a pre-read is performed by the bit-filter logic 660 of the buffer 650 to detect any defective memory cells before performing the write operation according to this aspect of the disclosure. Representatively, the write operation avoids the memory cell corresponding to storage area 672-4 because the storage area 672-4 of the temporary storage 670 is identified with the defective bit state "B". Accordingly, a data input value 662 is formed that avoids data storage within the defective memory cell of the memory device 640 that corresponds to storage area 672-4. In this aspect of the disclosure, the measurable resistance of the memory cell corresponding to the storage area 672-4 is set outside of a working resistance range during testing of the memory device 640, using the controller 630.

In one configuration, a memory device 440/540/640/740 is configured to includes data storage means for storing data. In one aspect of the disclosure, the data storage means may be a magnetic tunnel junction (MTJ) 110 or other like memory cell device including hut not limited to MRAM, RRAM, PC-RAM, or other like memory storage device configured to perform the functions recited by the data storage means. The memory device 440/540/640/740 is also configured to include a means for identifying at least one data storage means as having a defective bit state. In one aspect, the identification means may be the bit-filter logic 460/560/660/760, and/or the controller 130/430/530/630/730 configured to perform the functions recited by the identification means. In another aspect, the aforementioned means may be any module or any apparatus configured to perform the functions recited by the aforementioned means.

Figure 7:
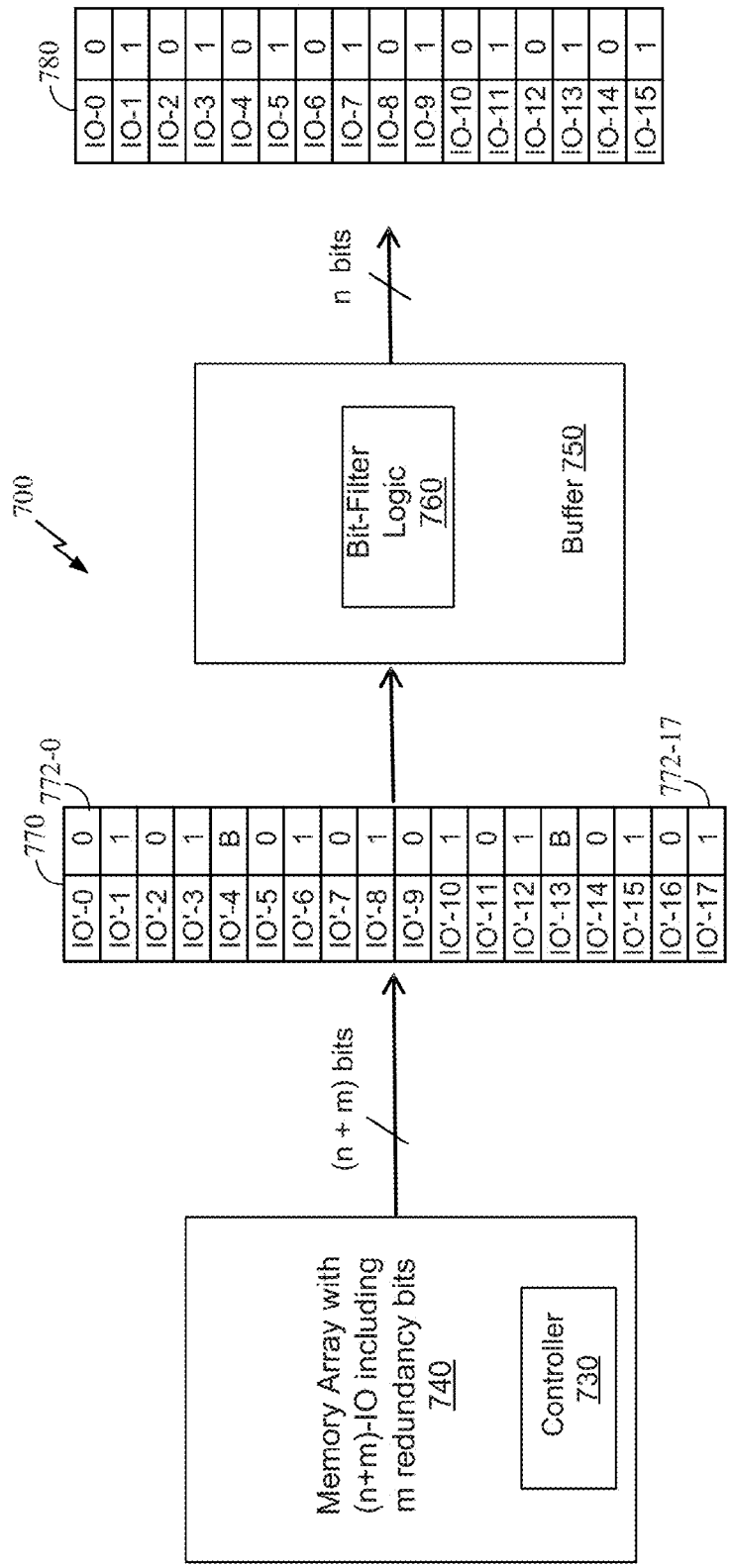
FIG. 7 is a block diagram illustrating an input/output interface that includes bit filter logic according to aspects of the present disclosure.

FIG. 7 is a block diagram illustrating an input/output interface 700, including a memory device 740 with an n+m memory cell array and a controller 730, and a buffer 750 that includes bit filter logic 760 according to aspects of the present disclosure. Representatively, the memory device 740 may include any number of I/O bit cells (n bits) with any number of redundancy bits (m bits). In one aspect of the disclosure, a number of redundancy bits is based on, for example, a random bit defect percentage rate report from the foundry. During operation, the bit filter logic 760 filters the I/O memory cells corresponding to storage areas 772 (772-0, . . . , 772-17) having the defective bit state "B". In this example, the information in the storage areas 772-4 and 772-13 are not passed to the user as the output data 780. In particular, the storage areas 772-5 and 772-14 correspond to defective IO memory cells that represent the m-redundancy bits for providing the 16-bit user output data value 780 to the user (e.g. n=16, m=2).

Figure 8:
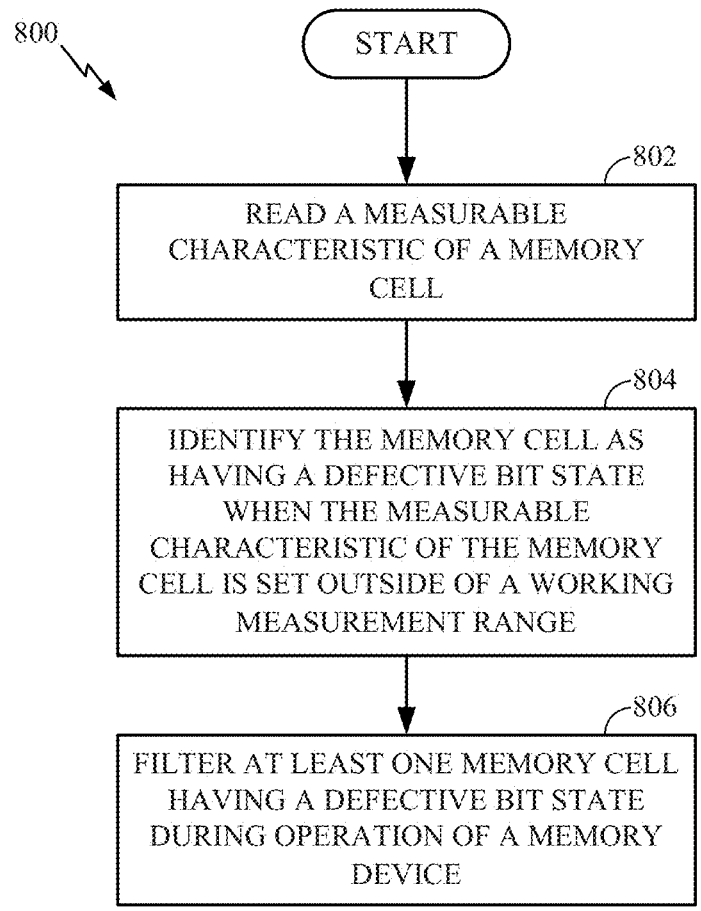
FIG. 8 is a flow chart illustrating a method for memory bit repair according to aspects of the disclosure.

FIG. 8 is a process flow diagram illustrating a method 800 for memory bit repair according to aspects of the present disclosure. The method 800 includes reading a measurable characteristic of a memory cell at block 802. For example, as shown in FIG. 5, during operation of the memory device 540, the bit filter logic 560 reads each of the storage areas 572 (572-0, . . . , 572-8) to determine whether a resistance range of any of the memory cells of the memory device 540 was set to be outside a working resistance range. Such an operation may occur during testing of the memory device 540. The method further includes identifying the memory cell as having a defective bit state when the measurable characteristic of the memory cell is set outside of the working measurable characteristic range at block 804. For example, FIG. 3 illustrates a working resistance range of 900 Ohms to 5100 Ohms. Referring again to FIG. 8, the memory cell(s) having a defective bit state is filtered during operation of the memory device at process block 806. In one configuration, memory cells that have a defective bit state are prohibited from being used during read operations and write operations of the memory device.

In one aspect of the disclosure, a new effective memory bit repair scheme enables memory bit repair by moving the defective bits outside a working measurement range. This scheme could be applied to any memory cell device including but not limited to MRAM, RRAM, PC-RAM, and other like memory storage devices. In the case of MRAM, a working resistance range is provided for avoiding defective MTJ bit cells. One aspect of this scheme could be applied to any number (n) of I/O bits with m redundancy bits. The number of redundancy bits may be determined based on data received from the foundry to determine a random memory bit defect percentage value or range (e.g., 10%).

An aspect of the scheme could be any method (not only by applying voltage or current to break down the interlayer oxide) to move the defective bits outside the working measurement range. For example, a two state MTJ could indicate a defective memory state and a non-defective memory state. The defective memory state detection involves determining a working measurement (e.g., resistance) range. Based on the working measurement range, MTJ bit cells, identified as outside the range, are avoided and data from these bit cells is not provided to a user as read values nor used to store write values.

Figure 9:
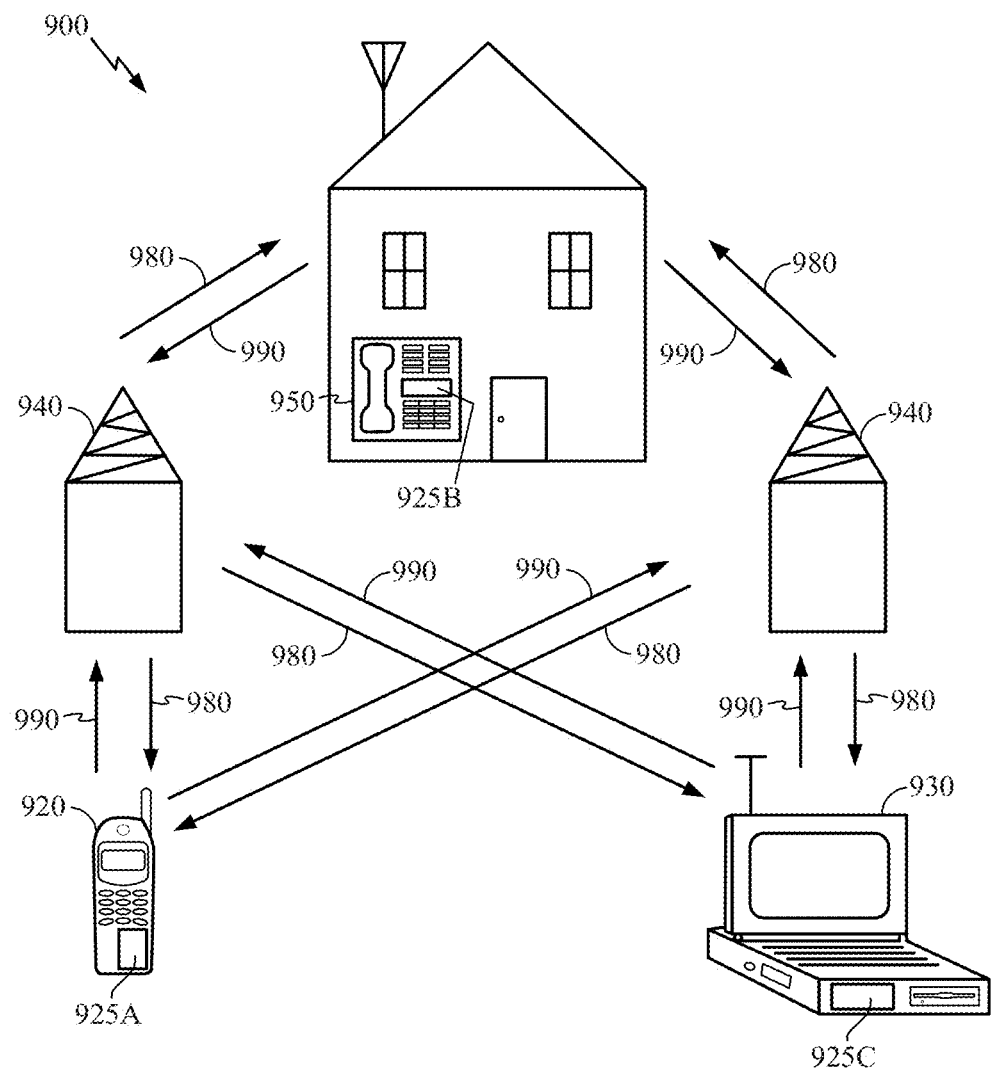
FIG. 9 is a block diagram illustrating a wireless communication system in which a configuration of the disclosure may be advantageously employed.

FIG. 9 is a block diagram showing a wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B that include the disclosed repaired MRAM. It will be recognized that other devices may also include the disclosed repaired MRAM, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and the remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 9 illustrates remote units according to the teachings of the disclosure, the disclosure is not limited to these exemplary illustrated units. Aspects of the disclosure may be suitably employed in any devices which include repaired MRAM.

Figure 10:
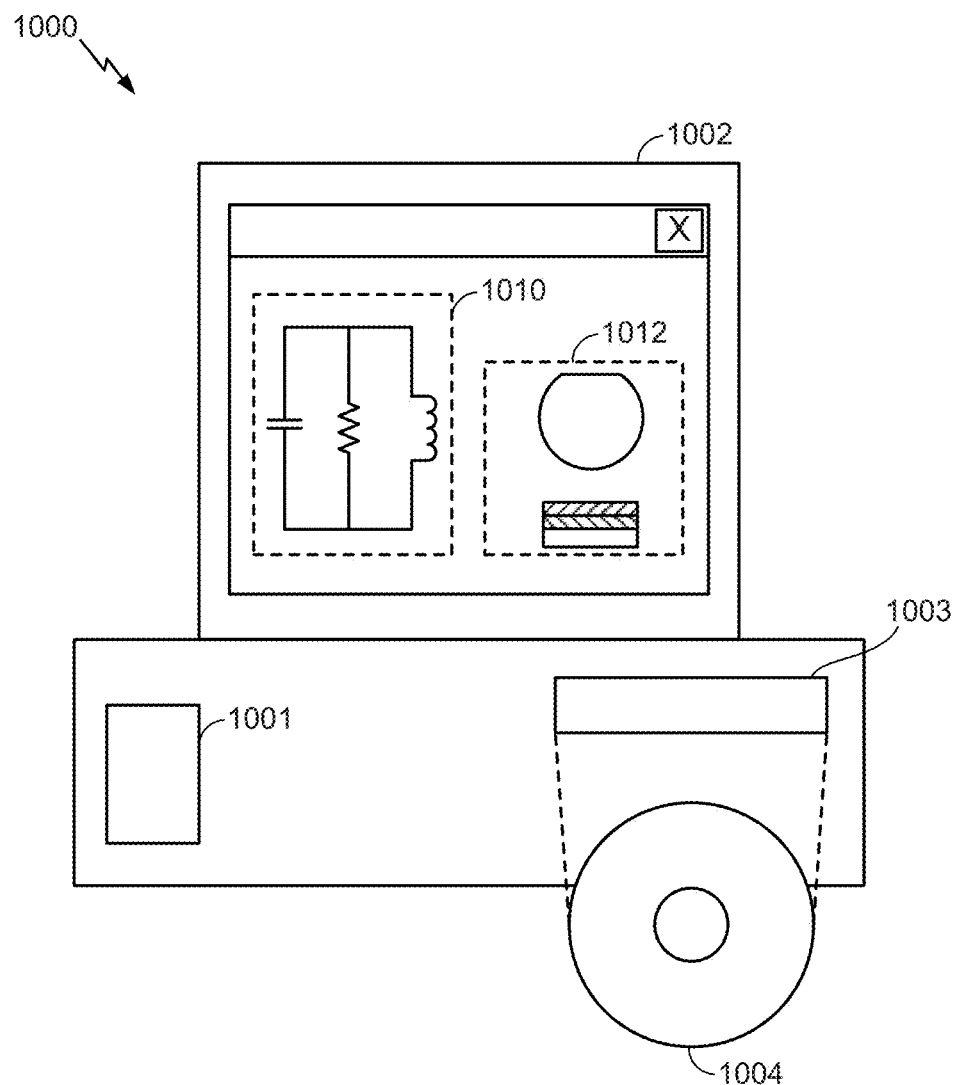
FIG. 10 is a block diagram illustrating a design workstation used for circuit, layout, and logic design of a semiconductor component according to one aspect of the present disclosure.

FIG. 10 is a block diagram illustrating a design workstation used for circuit, layout, and logic design of a semiconductor component, such as the MRAM disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as an MRAM. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A memory device, comprising:
a plurality of memory cells, each having a measurable characteristic that identifies a stored data value, at least one of the plurality of memory cells having a measurable characteristic that does not identify a stored data value, the measurable characteristic being set to a defective bit state outside of a working measureable characteristic range, the defective bit state identifying the at least one of the plurality of memory cells as being defective.

2. The memory device of claim 1, further comprising a controller communicatively coupled to the plurality of memory cells, operable to set the measureable characteristic of the at least one of the plurality of memory cells to be outside the working measureable characteristic range.

3. The memory device of claim 2, in which the controller is further operable to apply a predetermined voltage or current level to the at least one of the plurality of memory cells to breakdown an interlayer dielectric of the memory cell to store a measurable characteristic that is outside the working measurable characteristic range.

4. The memory device of claim 1, in which the measurable characteristic is resistance.

5. The memory device of claim 4, in which the plurality of memory cells comprise magnetic tunnel junctions (MTJs).

6. The memory device of claim 1, further comprising a buffer coupled to each of the plurality of memory cells, the buffer having filter logic operable to disregard a memory cell when the defective bit state is detected.

7. The memory device of claim 1, further comprising a filter logic communicably coupled to each of the plurality of memory cells, the filter logic being operable to remove the at least one of the plurality of memory cells having the defective bit state from use during operation of the memory device.

8. The memory device of claim 1, further comprising a controller communicably coupled to the plurality of memory cells, operable to perform a pre-read for a write operation to detect at least one memory cell identified as having the defective bit state and to perform a write operation to the plurality of memory cells other than the at least one memory cell identified as having the defective bit state.

9. The memory device of claim 1, integrated in at least one of a mobile phone, a set top box, a music player, a video player, an entertainment unit, a navigation device, a computer, a hand-held personal communication systems (PCS) unit, a portable data unit, and a fixed location data unit.

10. A method for repairing defective memory cells of a memory device, comprising:
reading a measurable characteristic of a memory cell of the memory device;
identifying the memory cell as having a defective bit state when the measurable characteristic of the memory cell does not identify a stored data value, the measurable characteristic being set outside of a working measurement range; and
filtering at least one memory cell having the defective bit state during operation of the memory device.

11. The method of claim 10, in which filtering comprises removing the at least one memory cell having the defective bit state from use during operation of the memory device.

12. The method of claim 10, further comprising:
performing a pre-read operation for a write operation to detect at least one memory cell identified as having the defective bit state; and
performing a write operation to a plurality of memory cells other than the at least one memory cell identified as having the defective bit state.

13. The method of claim 10, further comprising apply a predetermined voltage or current level to the at least one memory cell to breakdown an interlayer dielectric of the memory cell to store a measurable characteristic that is outside the working measurable characteristic range.

14. The method of claim 10, further comprising integrating the memory device into at least one of a mobile phone, a set top box, a music player, a video player, an entertainment unit, a navigation device, a computer, a hand-held personal communication systems (PCS) unit, a portable data unit, and a fixed location data unit.

15. A memory device, comprising:
a plurality of data storage means, each having a measurable characteristic that identifies a stored data value, at least one of the plurality of data storage means having a measurable characteristic that does not identify a stored data value, the measurable characteristic being set to a defective bit state outside of a working measureable characteristic range; and
means for identifying at least one data storage means as having the defective bit state.

16. The memory device of claim 15, further comprising means for setting the measureable characteristic of the at least one data storage means to be outside a working measureable characteristic range.

17. The memory device of claim 16, in which the means for setting the measurable characteristic is further operable for applying a predetermined voltage or current level to the data storage means to breakdown an interlayer dielectric of the data storage means to have a measurable characteristic that is outside the working measurable characteristic range.

18. The memory device of claim 15, incorporated into at least one of a music player, a video player, an entertainment unit, a navigation device, a communications device, a personal digital assistant (PDA), a fixed location data unit, and a computer.

19. A method for repairing defective memory cells of a memory device, comprising:
the step of reading a measurable characteristic of a memory cell of the memory device;
the step of identifying the memory cell as having a defective bit state when the measurable characteristic of the memory cell does not identify a stored data value, the measurable characteristic being set outside of a working measurement range; and
the step of filtering at least one memory cell having the defective bit state during operation of the memory device.

20. The method of claim 19, further comprising the step of incorporating the memory device into at least one of a music player, a video player, an entertainment unit, a navigation device, a communications device, a personal digital assistant (PDA), a fixed location data unit, and a computer.

* * * * *